United States Patent [19]

Uetani et al.

[11] Patent Number: 5,283,155
[45] Date of Patent: Feb. 1, 1994

[54] POSITIVE RESIST COMPOSITION COMPRISING AN ALKALI-SOLUBLE RESIN AND A QUINONE DIAZIDE SULFONIC ACID ESTER OF A HYDROXY FLAVAN DERIVATIVE

[75] Inventors: Yasunori Uetani; Hirotoshi Nakanishi; Yasunori Doi, all of Osaka, Japan

[73] Assignee: Sumitomo Chemical Company, Limited, Osaka, Japan

[21] Appl. No.: 688,514

[22] PCT Filed: Jan. 11, 1991

[86] PCT No.: PCT/JP91/00013

§ 371 Date: Jun. 11, 1991

§ 102(e) Date: Jun. 11, 1991

[87] PCT Pub. No.: WO92/12205

PCT Pub. Date: Jul. 23, 1992

[51] Int. Cl.⁵ .................. G03F 7/023; G03F 7/32
[52] U.S. Cl. .................. 430/192; 430/165; 430/191; 430/193; 430/326; 534/557
[58] Field of Search .............. 430/192, 193, 165, 191, 430/326; 534/556, 557

[56] References Cited

U.S. PATENT DOCUMENTS

| | | | |
|---|---|---|---|
| 2,767,092 | 10/1956 | Schmidt | 430/193 |
| 3,046,118 | 7/1962 | Schmidt | 430/192 |
| 3,046,119 | 7/1962 | Sus | 430/193 |
| 3,188,210 | 6/1965 | Fritz et al. | 430/193 |
| 4,883,739 | 11/1989 | Sakaguchi et al. | 430/192 |
| 5,059,507 | 10/1991 | Uetani et al. | 430/193 |
| 5,077,173 | 12/1991 | Schultz et al. | 430/192 |

FOREIGN PATENT DOCUMENTS

| | | |
|---|---|---|
| 61-118744 | 6/1986 | Japan . |
| 2-2559 | 1/1990 | Japan . |
| 2-19846 | 1/1990 | Japan . |
| 2-32352 | 2/1990 | Japan . |

OTHER PUBLICATIONS

Baker, McOmie, and Wild: Condensation, pp. 3060-3064, 596. Condensation Products of Phenols and Ketones. Part XII . . .

*Primary Examiner*—Charles L. Bowers, Jr.
*Assistant Examiner*—John S. Chu
*Attorney, Agent, or Firm*—Birch, Stewart, Kolasch & Birch

[57] ABSTRACT

A positive resist composition which comprises an alkali-soluble resin and, as a sensitizer, a quinone diazide sulfonic acid ester of a phenol compound of the formula:

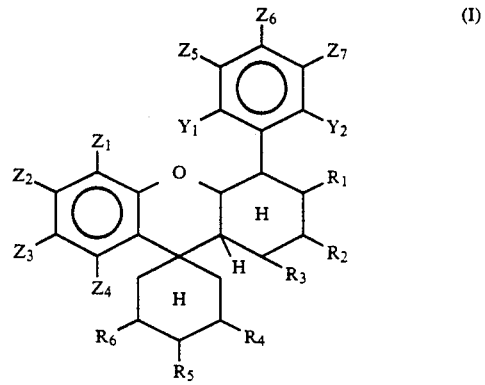

(I)

wherein $Y_1$, $Y_2$, $Z_1$, $Z_2$, $Z_3$, $Z_4$, $Z_5$, $Z_6$ and $Z_7$ are independently a hydrogen atom, a hydroxyl group, a $C_1$-$C_4$ alkyl group which may be substituted with a halogen atom, provided that at least one of $Y_1$ and $Y_2$ is a hydroxyl group, and at least two of $Z_1$ to $Z_7$ are hydroxyl groups, and $R_1$, $R_2$, $R_3$, $R_4$, $R_5$ and $R_6$ are independently a hydrogen atom, a $C_1$-$C_{10}$ alkyl group, a $C_1$-$C_4$ alkenyl group, a cycloalkyl group or an aryl group, which composition has a high γ-value.

10 Claims, No Drawings

POSITIVE RESIST COMPOSITION COMPRISING AN ALKALI-SOLUBLE RESIN AND A QUINONE DIAZIDE SULFONIC ACID ESTER OF A HYDROXY FLAVAN DERIVATIVE

FIELD OF THE INVENTION

The present invention relates to a resist composition which has a high γ-value.

BACKGROUND ART

A composition containing a compound having a quinone diazide group and an alkali-soluble resin finds use as a positive resist, because upon exposure to light having a wavelength of 300 to 500 nm, the quinone diazide group decomposes to form a carboxyl group whereby the originally alkali-insoluble composition becomes alkali-soluble. The positive resist composition has much better resolution than a negative resist composition and is used in the production of integrated circuits such as IC or LSI.

Recently, particularly with integrated circuits, miniaturization has proceeded with a rise in the integration level, which results in demands for formation of patterns of submicron order and more excellent resolution (high γ-value). However, a resist composition comprising a conventional quinone diazide compound and a conventional alkali-soluble resin has a limit in increase of the γ-value.

For example, if the amount of quinone diazide compound is increased to improve the γ-value, serious problems such as deterioration of sensitivity and increase of residues after developing arise. Therefore, the improvement of the γ-value is limited.

DISCLOSURE OF THE INVENTION

An object of the present invention is to provide a positive resist composition which has a higher γ-value.

The present invention is based on the finding that, when a quinone diazide sulfonic acid ester of a polyvalent phenol having a specific chemical structure is used as a sensitizer, the positive resist composition has a much increased γ-value.

Accordingly, the present invention provides a positive resist composition which comprises an alkali-soluble resin and, as a sensitizer, a quinone diazide sulfonic acid ester of a phenol compound of the formula:

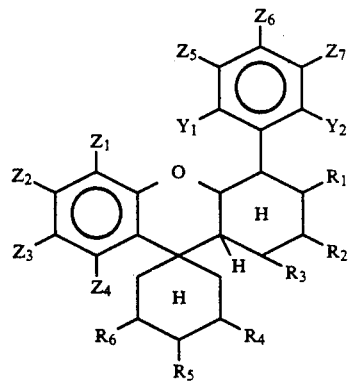

(I)

wherein $Y_1$, $Y_2$, $Z_1$, $Z_2$, $Z_3$, $Z_4$, $Z_5$, $Z_6$ and $Z_7$ are independently a hydrogen atom, a hydroxyl group or a $C_1$–$C_4$ alkyl group which may be substituted with a halogen atom provided that at least one of $Y_1$ and $Y_2$ is a hydroxyl group, and at least two of $Z_1$ to $Z_7$ are hydroxyl groups.

In particular, the phenol compound (I) in which two of $Z_1$ to $Z_7$ are hydroxyl groups is preferred since the resist composition containing the quinone diazide sulfonic ester of such phenol has a particularly high γ-value.

In addition, the phenol compound (I) in which at least one of $Z_1$, $Z_2$, $Z_3$ and $Z_4$ is a hydroxyl group and at least one of $Z_5$, $Z_6$ and $Z_7$ is a hydroxyl group is preferred since the resist composition has a high film thickness retention.

In the general formula (I), $R_1$ to $R_6$ are independently a $C_1$–$C_{10}$ alkyl group (e.g. a methyl group, an ethyl group, etc.), a $C_1$–$C_4$ alkenyl group, a cycloalkyl group or an aryl group or a hydrogen atom.

Specific examples of the phenol compound (I) are

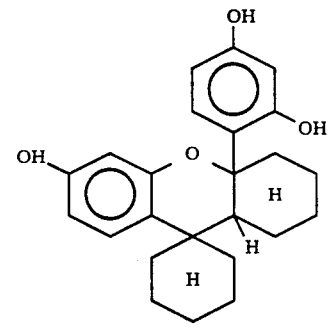

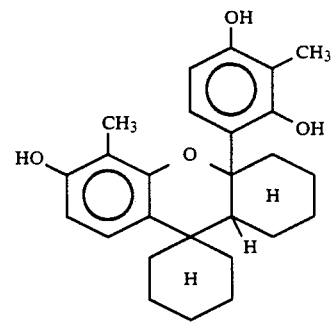

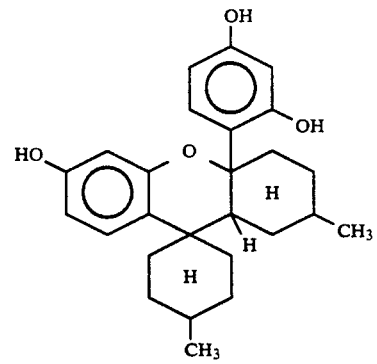

The quinone diazide sulfonic acid ester of the phenol compound may be prepared by a per se conventional method. For example, the ester is prepared by a condensation reaction of the phenol compound with naphthoquinone diazide sulfonyl halogenide or benzoquinone diazide sulfonyl halogenide in the presence of a weak alkali such as sodium carbonate.

The quinone diazide sulfonic acid esters may be used alone or in combination.

To the resist composition of the present invention, a quinone diazide sulfonic acid ester of other polyvalent phenol compounds may be added. Examples of the other polyvalent phenol compounds are hydroquinone; resorcinol; phloroglucin; 2,4-dihydroxybenzophenone; trihydroxybenzophenones such as 2,3,4-trihydroxybenzophenone, 2,2',3-trihydroxybenzophenone, 2,2',4-trihydroxybenzophenone, 2,2',5-trihydroxybenzophenone, 2,3,3'-trihydroxybenzophenone, 2,3,4'-trihydroxybenzophenone, 2,3',4-trihydroxybenzophenone, 2,3',5-trihydroxybenzophenone, 2,4,4'-trihydroxybenzophenone, 2,4',5-trihydroxybenzophenone, 2',3,4-trihydroxybenzophenone, 3,3',4-trihydroxybenzophenone and 3,4,4'-trihydroxybenzophenone; tetrahydroxybenzophenones such as 2,3,3',4-tetrahydroxybenzophenone, 2,3,4,4'-tetrahydroxybenzophenone, 2,2',4,4'-tetrahydroxybenzophenone, 2,2',3,4-tetrahydroxybenzophenone, 2,2',3,4'-tetrahydroxybenzophenone, 2,2',5,5'-tetrahydroxybenzophenone, 2,3',4',5-tetrahydroxybenzophenone and 2,3',5,5'-tetrahydroxybenzophenone; pentahydroxybenzophenones such as 2,2',3,4,4'-pentahydroxybenzophenone, 2,2',3,4,5'-pentahydroxybenzophenone, 2,2',3,3',4-pentahydroxybenzophenone and 2,3,3',4,5'-pentahydroxybenzophenone; hexahydroxybenzophenones such as 2,3,3',4,4',5'-hexahydroxybenzophenone and 2,2',3,3',4,5'-hexahydroxybenzophenone; alkyl gallates; oxyflavans; etc.

A novolak resin is preferably used as the alkali-soluble resin. The novolak resin is prepared by an addition condensation reaction of a phenol with formaldehyde. Specific examples of the phenol used as one of the raw materials for the novolak resin include phenol, cresol, xylenol, ethylphenol, trimethylphenol, propylphenol, methylbutylphenol, butylphenol, dihydroxybenzene, naphthols, etc. These phenols may be used alone or in combination.

The formaldehyde which undergoes the addition condensation reaction with the phenol can be used in the form of an aqueous solution of formaldehyde (formalin) or paraformaldehyde. In particular, 37% formalin which is commercially mass produced is suitably used.

The addition condensation reaction of the phenol with formaldehyde can be carried out according to a usual method. This reaction is carried out at a temperature of from 60° to 120° C. for 2 to 30 hours. Organic acids, inorganic acids or divalent metal salts are used as catalysts. Specifically, exemplified are oxalic acid, hydrochloric acid, sulfuric acid, perchloric acid, p-toluenesulfonic acid, trichloroacetic acid, phosphoric acid, formic acid, zinc acetate, magnesium acetate, etc.

The reaction may be carried out in the presence or absence of a solvent.

The amount of the quinone diazide sulfonic acid ester to be added to the resist composition is from 15 to 50% by weight based on the total weight of the solid components in the resist composition.

The amount of the alkali-soluble resin is from 50 to 85% by weight based on the total weight of the solid components in the resist composition.

The positive photoresist is prepared by mixing and dissolving the quinone diazide sulfonic acid ester and the alkali-soluble resin in a solvent. Preferably, the used solvent evaporates at a suitable drying rate to give a uniform and smooth coating film. Such solvent includes ethylcellosolve acetate, methylcellosolve acetate, ethylcellosolve, methylcellosolve, propylene glycol monomethyl ether acetate, butyl acetate, methyl isobutyl ketone, xylene, etc. The amount of the solvent is, for example, from 50 to 80% by weight in case of ethylcellosolve acetate.

To the positive photoresist composition obtained by the foregoing method, small amounts of resins, dyes, etc. may be added if desired.

With the resist composition of the present invention, the γ-value can be improved, and the problems associated with increase of developing residues can be solved.

EXAMPLES

The present invention will be illustrated more in detail with the following Examples, but it is not limited to these Examples. In Examples, "parts" are by weight.

Synthetic Example 1

In a 500 ml four-necked flask, resorcinol (88 g), water (241.4 g) and 36% hydrochloric acid (22.6 g) were charged and heated to 50° to 55° C. to obtain a homogeneous solution. To the solution, cyclohexane (19.6 g) was dropwise added over 60 minutes, and the mixture was stirred at 50° to 55° C. for 6 hours. After cooling to room temperature, a precipitated cake was recovered by filtration and washed with water (2 liters). The wet cake was dissolved in ethyl acetate (500 g) and washed with water (500 g) till an aqueous phase became neutral.

After separation, ethyl acetate was evaporated off under reduced pressure from the aqueous phase to obtain a residue (75.2 g). To the residue, toluene (75 g) was added and heated to 80° C. to form a homogeneous solution. After cooling to 25° C., the mixture was cooled with ice and kept at a temperature not higher than 5° C. for one hour, followed by filtration.

A wet cake was washed with toluene (30 g). The washed cake was added to toluene (48 g) and heated to 80° C. followed by stirring for one hour. Then, the mixture was cooled to 25° C. and filtrated. A cake was washed with toluene (30 g) and dried to obtain a white crystal compound (27.6 g) of the formula (II):

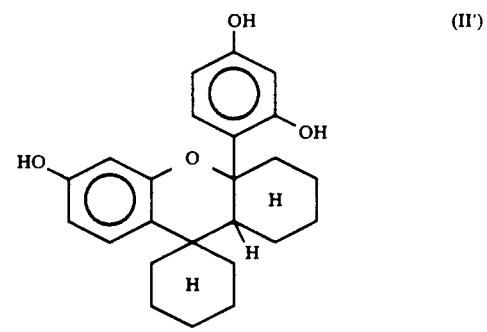

FDMS: 380. Melting point: 259–261° C.

Reference Example 1

In a 300 ml three-necked flask, the compound (II) obtained in Synthetic Example 1 (6.00 g), naphthoquinone(1,2)-diazide-(2)-5-sulfonyl chloride (8.49 g) (a molar ratio of the compound (II) to the sulfonyl chloride being 1:2) and dioxane (168 g) were charged and stirred to achieve complete dissolution. Then, Triethylamine (4.45 g) was dropwise added over 30 minutes while stirring on a water bath to keep the reaction temperature at 20°–25° C. Reaction was carried out with stirring for further 4 hours at 20°-25° C. The reaction solution was then charged into ion-exchanged water, filtrated and dried to obtain a sensitizer, which is referred to as Sensitizer A.

Reference Examples 2 and 3

In the same manner as in Reference Example 1 except that 2,2',4-trihydroxybenzophenone or 2,3,4-trihydroxybenzophenone was used in place of the compound (II), Sensitizer B or C was prepared.

Example 1 and Comparative Examples 1 and 2

The sensitizer prepared in each of Reference Examples and a novolak resin in amounts shown in Table 1 were dissolved in 48 parts of ethyl cellosolve acetate to prepare a resist solution, which was filtrated through a Teflon (trademark) filter of 0.2 μm in pore size. The resist solution was coated on a silicon wafer, which had been rinsed in a usual way, by means of a spinner so as to form a resist film of 1.3 μm in thickness. Subsequently, the silicon wafer was baked for 60 seconds on a hot plate kept at 100° C., and exposed to light having a wavelength of 436 nm (g line) while varying the exposure time stepwise by means of a reduction projection exposing apparatus (DSW 4800 with NA=0.28 manufactured by GCA). Thereafter, the silicon wafer was developed for one minute in a developing solution (SOPD manufactured by Sumitomo Chemical Company, Limited) to obtain a positive pattern.

The γ-value is expressed in terms of tan θ the angle θ of which is obtained by plotting the rate of the standardized film thickness (=the retained film thickness/the original film thickness) against the exposure time and calculating the inclination of the plotted line.

The results are shown in Table 1.

TABLE 1

| Example No. | Resist composition | | γ-Value |
|---|---|---|---|
| | Novolak resin*) (parts) | Sensitizer (parts) | |
| 1 | 17 | A 5 | 4.1 |
| C. 1 | 17 | B 5 | 2.5 |
| C. 2 | 17 | C 5 | 2.3 |

Note:
*)Novolak resin: A cresol mixture (the molar ratio of m-isomer to p-isomer = 7:3) was reacted with formalin (the molar ratio of the cresols to formalin = 1:0.8) using oxalic acid as a catalyst under reflux to obtain a novolak resin of 9800 in a weight average molecular weight calculated as polystyrene.

What is claimed is:

1. A positive resist composition which comprises in admixture an alkali-soluble resin and, as a sensitizer, a quinone diazide sulfonic acid ester of a phenol compound of the formula:

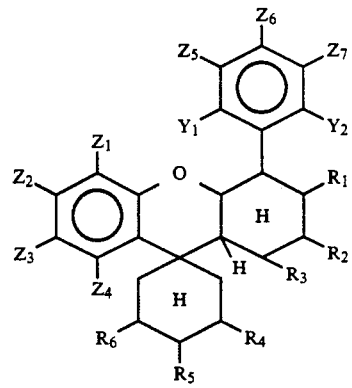

(I)

wherein $Y_1$, $Y_2$, $Z_1$, $Z_2$, $Z_3$, $Z_4$, $Z_5$, $Z_6$ and $Z_7$ are independently a hydrogen atom, a hydroxyl group, a $C_1$-$C_4$ alkyl group which may be substituted with a halogen atom, provided that at least one of $Y_1$ and $Y_2$ is a hydroxyl group, and at least two of $Z_1$ to $Z_7$ are hydroxyl groups, and $R_1$, $R_2$, $R_3$, $R_4$, $R_5$ and $R_6$ are independently a hydrogen atom, a $C_1$-$C_{10}$ alkyl group, a $C_1$-$C_4$ alkenyl group, a cycloalkyl group or an aryl group.

2. The positive resist composition according to claim 1, wherein two of $Z_1$ to $Z_7$ are hydroxyl groups.

3. The positive resist composition according to claim 1, wherein at least one of $Z_1$, $Z_2$, $Z_3$ and $Z_4$ is a hydroxyl group and at least one of $Z_5$, $Z_6$ and $Z_7$ is a hydroxyl group.

4. The positive resist composition according to claim 1, wherein said phenol compound of formula (I) is:

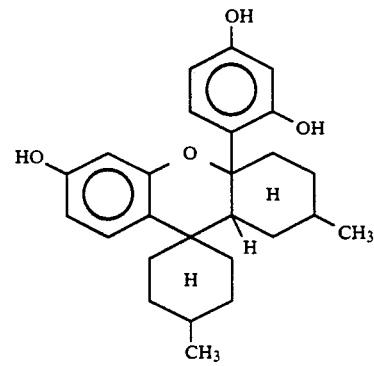

5. The positive resist composition according to claim 1, wherein said phenol compound of formula (I) is:

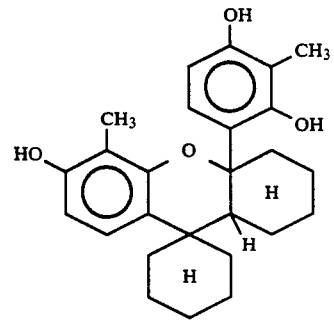

6. The positive resist composition according to claim 1, wherein said phenol compound of formula (I) is:

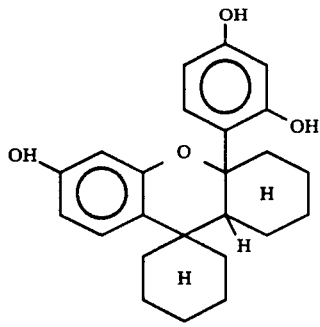

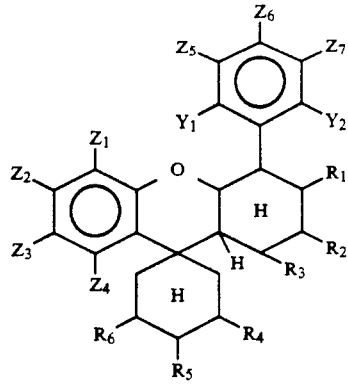

7. The positive resist composition according to claim 1, wherein said quinone diazide sulfonic acid ester is present in an amount of from 15 to 30% by weight based on the total weight of solid components in said resist composition.

8. The positive resist composition according to claim 1, wherein said alkali-soluble resin is present in an amount of from 50 to 85% by weight based on the total weight of solid components in said resist composition.

9. The positive resist composition which comprises in admixture an alkali-soluble resin and, as a sensitizer, a quinone diazide sulfonic acid ester of a phenol compound of the formula:

wherein $Y_1$, $Y_2$, $Z_1$, $Z_2$, $Z_3$, $Z_4$, $Z_5$, $Z_6$ and $Z_7$ are independently a hydrogen atom, a hydroxyl group, a $C_1$–$C_4$ alkyl group which may be substituted with a halogen atom, provided that at least one of $Y_1$ and $Y_2$ is a hydroxyl group, and at least two of $Z_1$ to $Z_7$ are hydroxyl groups, and $R_1$, $R_2$, $R_3$, $R_4$, $R_5$ and $R_6$ are independently a hydrogen atom, a $C_1$–$C_{10}$ alkyl group, a $C_1$–$C_4$ alkenyl group, a cycloalkyl group or an aryl group, wherein two of $Z_1$ to $Z_7$ are hydroxyl groups,
wherein said quinone diazide sulfonic acid ester is present in an amount of from 15 to 30% by weight based on the total weight of solid components in said resist composition,
and wherein said alkali-soluble resin is present in an amount of from 50 to 85% by weight based on the total weight of solid components in said resist composition.

10. The positive resist composition according to claim 9, wherein at least one of $Z_1$, $Z_2$, $Z_3$ and $Z_4$ is a hydroxyl group and at least one of $Z_5$, $Z_6$ and $Z_7$ is a hydroxyl group.

* * * * *

UNITED STATES PATENT AND TRADEMARK OFFICE
CERTIFICATE OF CORRECTION

PATENT NO. : 5,283,155  
DATED : February 1, 1994  
INVENTOR(S) : Uetani et al.

Page 1 of 2

It is certified that error appears in the above-indentified patent and that said Letters Patent is hereby corrected as shown below:

Changing formula (I) as it appears in the Abstract beginning at line 4; column 1, lines 49-64; column 6, lines 1-17; and column 8, lines 1-17; from "
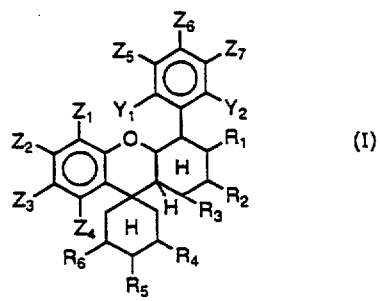
(I)
"

to

UNITED STATES PATENT AND TRADEMARK OFFICE
CERTIFICATE OF CORRECTION

PATENT NO.   :   5,283,155
DATED        :   February 1, 1994
INVENTOR(S)  :   Uetani, et al It is certified that error appears in the above-indentified patent and that said Letters Patent is hereby corrected as shown below:

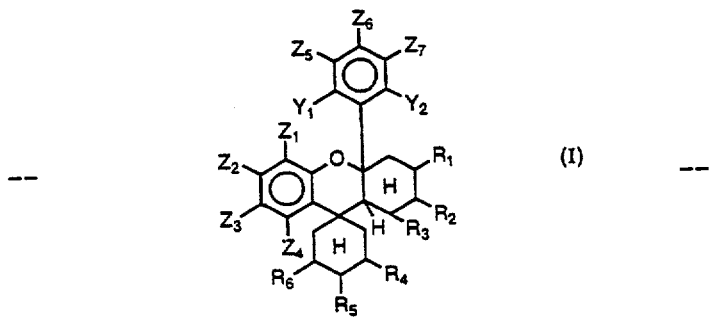         (I)

Signed and Sealed this

Sixth Day of September, 1994

Attest:

BRUCE LEHMAN

Attesting Officer         Commissioner of Patents and Trademarks